United States Patent
Zhang

(10) Patent No.: US 10,410,356 B2
(45) Date of Patent: Sep. 10, 2019

(54) METHOD FOR PROCESSING THE LEF DIAGRAM OF A LAYOUT

(71) Applicant: SHANGHAI HUAHONG GRACE SEMICONDUCTOR MANUFACTURING CORPORATION, Shanghai (CN)

(72) Inventor: Xingzhou Zhang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 323 days.

(21) Appl. No.: 15/609,490

(22) Filed: May 31, 2017

(65) Prior Publication Data
US 2018/0189952 A1    Jul. 5, 2018

(30) Foreign Application Priority Data
Jan. 4, 2017    (CN) .......................... 2017 1 0004605

(51) Int. Cl.
*G06T 7/187* (2017.01)
*G06F 17/50* (2006.01)

(52) U.S. Cl.
CPC .......... *G06T 7/187* (2017.01); *G06F 17/5068* (2013.01)

(58) Field of Classification Search
CPC . G06T 7/187; G06F 17/5068; G06F 17/5081; G06F 17/5072; G06F 17/5045
See application file for complete search history.

(56) References Cited

U.S. PATENT DOCUMENTS

| | | | | |
|---|---|---|---|---|
| 6,895,568 B2* | 5/2005 | Li | ........................ | G06F 17/5081 716/112 |
| 7,096,447 B1* | 8/2006 | Li | ........................ | G06F 17/5081 716/112 |
| 7,530,042 B1* | 5/2009 | Beckenbaugh | ..... | G06F 17/5081 716/126 |
| 8,195,697 B2* | 6/2012 | Maeda | ................ | G06F 17/5045 707/793 |
| 8,661,390 B2* | 2/2014 | Cheng | ................ | G06F 17/5072 716/118 |
| 8,984,449 B1* | 3/2015 | Li | ........................ | G06F 17/5081 430/30 |
| 2004/0025125 A1* | 2/2004 | Li | ........................ | G06F 17/5068 716/112 |
| 2005/0160393 A1* | 7/2005 | Kobayashi | ................ | G03F 1/36 716/52 |
| 2006/0101428 A1* | 5/2006 | Adke | ................... | G06F 17/5045 717/136 |
| 2008/0022250 A1* | 1/2008 | Nagarajan | ........... | G06F 17/5072 716/122 |
| 2012/0233575 A1* | 9/2012 | Kashyap | ............. | G06F 17/5068 716/55 |

(Continued)

*Primary Examiner* — Wesley J Tucker
(74) *Attorney, Agent, or Firm* — MKG, LLC

(57) ABSTRACT

A method for processing the Library Exchange Format (LEF) diagram of a layout includes the following steps: Step 1, breaking the LEF diagram into multiple rectangular segments; Step 2, numbering all rectangular segments; and Step 3, combining rectangular segments to obtain a larger rectangular segment and replacing corresponding uncombined rectangular segments with the larger combined rectangular segment. The method reduces the data size of the LEF file and increase the data transmission efficiency of the LEF file.

8 Claims, 10 Drawing Sheets

(56) References Cited

U.S. PATENT DOCUMENTS

2013/0074024 A1* 3/2013 Chase ................. G06F 17/5081
  716/112
2017/0193147 A1* 7/2017 Hsieh ........................ G03F 1/36

* cited by examiner

METHOD FOR PROCESSING THE LEF DIAGRAM OF A LAYOUT

FIELD OF THE INVENTION

The present invention relates to a process or method in manufacturing semiconductor integrated circuits (IC), in particular to a method for processing the LEF diagram of a layout.

BACKGROUND OF THE INVENTION

An IP module is a kind of integrated circuit, device or component with some specified function which is designed in advance and even has been verified. The foundry's self-developed IP module is often used for client's chip data, i.e. layout data, while the unit module in the layout data used by the client to be integrated with the IP module contains only a file in the Library Exchange Format (LEF). The LEF file mainly defines the physical information of the unit module, such as cell sizes, geometric shape, route layers, etc. Since the unit module does not have an internal circuit, it is like an IP black box with only connection information and no internal circuits. Before taping out, the IP module needs to be integrated (or incorporated) into the diagram data provided by the client, and the whole process of data integration needs to be carried out by engineers of the foundry. The client mentioned above means the chip designer, and the foundry proceeds to the fabrication of chips with the client's commission; the diagram data and the IP module data are both in GDS format.

Some information about the LEF file needs to be provided for the client during layout design stage, so that the client may proceed to the integration of the IP module according to such information. The information provides the placing and routing tool with knowledge of the processes applied and geometric properties of each layout cells, generally including:

1. Device cell names, cell borders and the coordinates of the origin;
2. Pin names, the metal layer, and the input/output;
3. Other parasitic parameters.

A specific example is given to explain the structure of the LEF diagram. FIG. 1 is the LEF diagram of an existing phase inverter. The diagram includes an input 101 designated by I, an output 102 designated by O, a power supply 103 designated by VSS, a ground terminal 104 designated by GND, where input I is a rectangle, while none of power supply VSS, output O and ground terminal GND is a rectangle.

Before representing the LEF diagram in FIG. 1, various shapes in the diagram need to be segmented into rectangles. As shown in FIG. 2, output 102 in FIG. 1 is segmented with the prior art, where the LEF diagram is segmented according to the coordinates of the vertices of the polygon. And the polygonal structure of output 102 is made up of multiple smaller rectangles. The segment designated by 201 as shown in FIG. 2 represents the smallest rectangular segment. The segmentation method in the prior art enables the representation of the LEF diagram of a polygon with multiple rectangles, but increase the data size of the diagram, which constitutes a problem, as the prior art will make the data size of the LEF diagram of a layout grow continuously with the development of the processes.

SUMMARY OF THE INVENTION

One of the technical problems the present invention is trying to solve is to provide a method for processing the LEF diagram of a layout, which reduces the size of the LEF file and increases the data transmission efficiency of the LEF file.

To solve the above-mentioned technical problem, the present invention provides a method for processing the LEF diagram of a layout, which includes the following steps:

Step 1, breaking the LEF diagram into multiple rectangular segments according to the coordinates of vertices of the LEF diagram;

Step 2, numbering all rectangular segments;

Step 3, combining adjacent rectangular segments to obtain a larger rectangular segment and replacing corresponding uncombined rectangular segments with the larger combined rectangular segment, thereby reducing the total number of rectangular segments in the LEF diagram and reducing the data size of the LEF file.

Further, the combination in Step 3 is carried out segment by segment according to the numbers of all rectangular segments.

Further, the segment by segment combination is carried out in the following steps:

Step 31, checking whether each of the rectangular segments can be combined with its adjacent rectangular segments according to their numbers, and when there are combinable rectangular segments, selecting each combinable rectangular segment and proceeding to Step 32; otherwise, skipping to Step 35;

Step 32, beginning with the two adjacent rectangular segments which produce the largest combined segment, proceeding with combination segment by segment to obtain combined segments in progressively decreasing size, with the largest combined segment being formed the earliest;

Step 33, renumbering all combined rectangular segments;

Step 34, repeating Steps 31-33 on each renumbered combined rectangular segment;

Step 35, ending the segment by segment combination.

Further, Step 31 is carried out by starting combination check with the rectangular segment with the smallest number and by adding 1 to the number of the rectangular segment which has been checked for the presence of combinable adjacent rectangular segments, till all numbered rectangular segments are checked.

Further, Step 31 is carried out by starting combination check with the rectangular segment with the largest number and by deducting 1 from the number of the rectangular segment which has been checked for the presence of combinable adjacent rectangular segments, till all numbered rectangular segments are checked.

Further, Step 1 applies EDA tools to segmenting the LEF diagram into multiple rectangular segments.

Further, rectangular segments are numbered by:

Dividing all two-dimensional rectangular segments into multiple rows, starting from the bottom row upward, numbering all rectangular segments in each row from left to right in a progressively increasing manner, and taking 1 added to the largest number of each row as the smallest number of next row;

Alternatively, dividing all two-dimensional rectangular segments into multiple rows, starting from the bottom row upward, numbering all rectangular segments in each row from right to left in a progressively increasing manner, and taking 1 added to the largest number of each row as the smallest number of next row;

Alternatively, dividing all two-dimensional rectangular segments into multiple rows, starting from the top row downward, numbering all rectangular segments in each row from left to right in a progressively increasing manner, and taking 1 added to the largest number of each row as the smallest number of next row;

Alternatively, dividing all two-dimensional rectangular segments into multiple rows, starting from the top row downward, numbering all rectangular segments in each row from right to left in a progressively increasing manner, and taking 1 added to the largest number of each row as the smallest number of next row.

Further, Step 2 of numbering all rectangular segments is carried out by:

Dividing all two-dimensional rectangular segments into multiple columns, starting from the leftmost column rightward, numbering all rectangular segments in each column from top to bottom in a progressively increasing manner, and taking 1 added to the largest number of each column as the smallest number of next column;

Alternatively, dividing all two-dimensional rectangular segments into multiple columns, starting from the leftmost column rightward, numbering all rectangular segments in each column from bottom to top in a progressively increasing manner, and taking 1 added to the largest number of each column as the smallest number of next column;

Alternatively, dividing all two-dimensional rectangular segments into multiple columns, starting from the rightmost column leftward, numbering all rectangular segments in each column from top to bottom in a progressively increasing manner, and taking 1 added to the largest number of each column as the smallest number of next column;

Alternatively, dividing all two-dimensional rectangular segments into multiple columns, starting from the rightmost column leftward, numbering all rectangular segments in each column from bottom to top in a progressively increasing manner, and taking 1 added to the largest number of each column as the smallest number of next column.

Compared with the prior art, the method for processing the LEF diagram of a layout in the present invention is carried out by breaking the LEF diagram into multiple rectangular segments, numbering all rectangular segments, and then combining adjacent rectangular segments to obtain a larger rectangular segment and replacing corresponding uncombined rectangular segments with the larger combined rectangular segment, thereby reducing the total number of rectangular segments in the LEF diagram and reducing the data size of the LEF file. Compared with the prior art of extracting the LEF diagram with EDA tools, the present invention achieves a better data compression ratio, because:

In LEF diagram, the relationship between the rectangular segments and the data size consists in every rectangular segment being denoted by the coordinates of its four vertices, where the coordinates are two-dimensional and are expressed by x and y axis coordinates, and the x and y axis coordinates of every vertex being stored in the data of the LEF diagram, which means the LEF diagram can be expressed by these data. Since in accordance with the present invention, the total number of rectangular segments of the LEF diagram is reduced, and therefore the data size of the LEF diagram is reduced accordingly, thereby achieving a better compression ratio.

Moreover, since the present invention reduces the data size of the LEF diagram, the data transmission efficiency of the LEF file is improved, which is conducive to the data transmission of large-scale design data in new processes.

Furthermore, the segment by segment combination of the present invention helps realize the optimal combination in the LEF diagram, thereby brings about a highest data compression ratio.

BRIEF DESCRIPTION OF THE DRAWINGS

A more detailed description of the present invention is made in the following part by reference to the accompanying drawings and embodiments.

DETAILED DESCRIPTION

Figure 3:
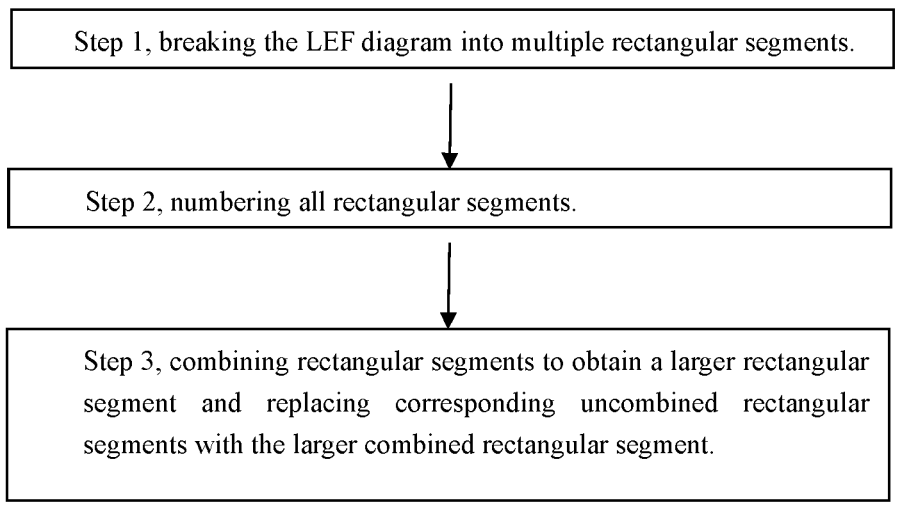
FIG. 3 is a flow chart in accordance with an embodiment of the present invention.

As shown in FIG. 3, which provides a flow chart in accordance with an embodiment of the present invention, the method for processing the LEF diagram of a layout includes the following steps:

Step 1, breaking the LEF diagram into multiple rectangular segments according to the coordinates of vertices;

Step 2, numbering all rectangular segments;

Step 3, combining adjacent rectangular segments to obtain a larger rectangular segment and replacing corresponding uncombined rectangular segments with the larger combined rectangular segment, thereby reducing the total number of rectangular segments in the LEF diagram and reducing the data size of the LEF file.

Figure 1:
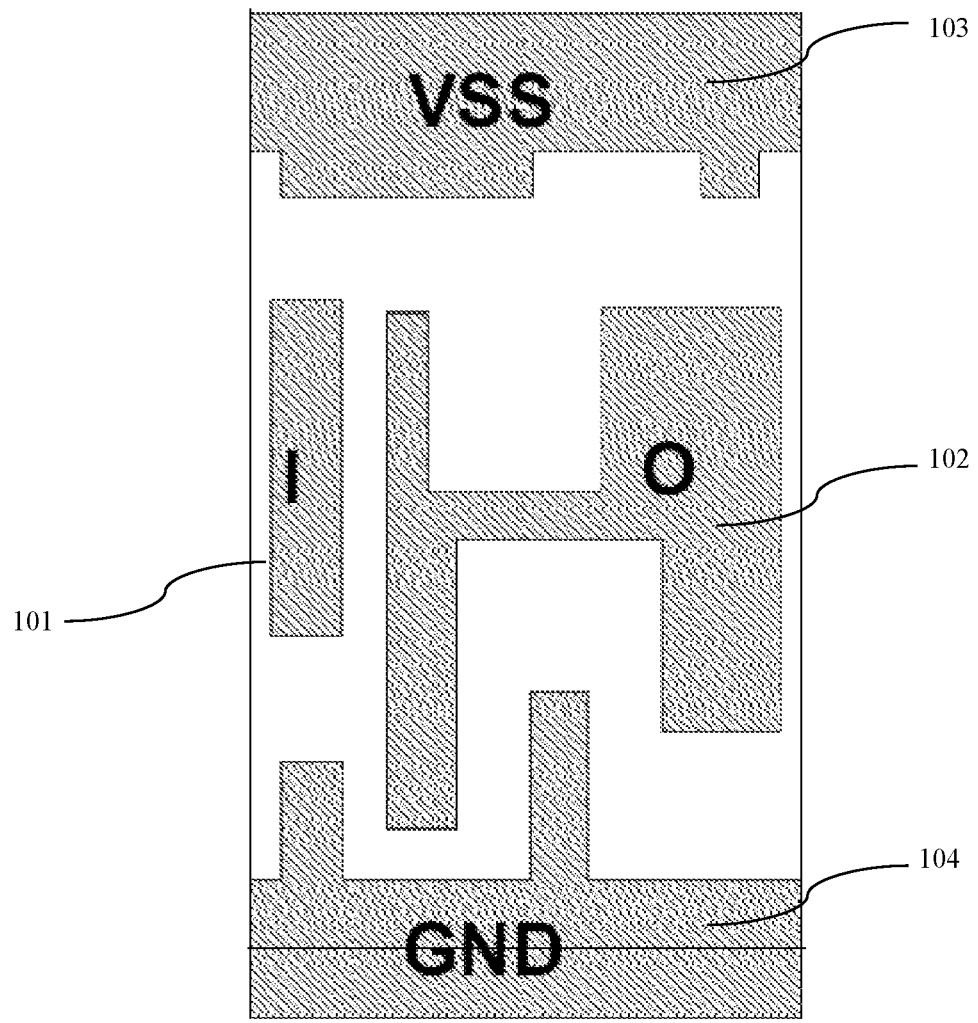
FIG. 1 is the LEF diagram of an existing phase inverter.
Figure 2:
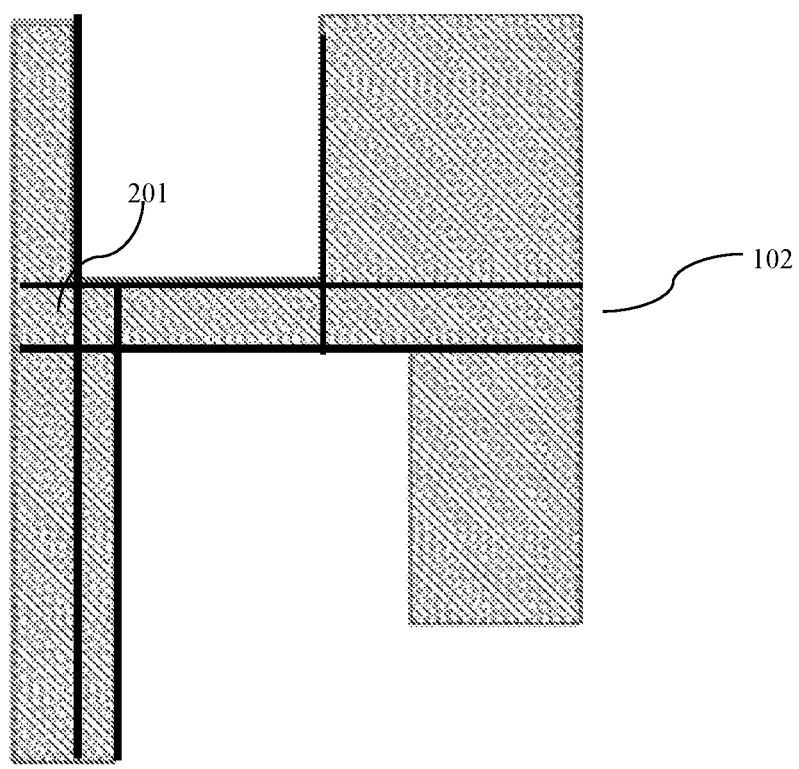
FIG. 2 is the output diagram segmented by a method of the prior art.
Figure 4:
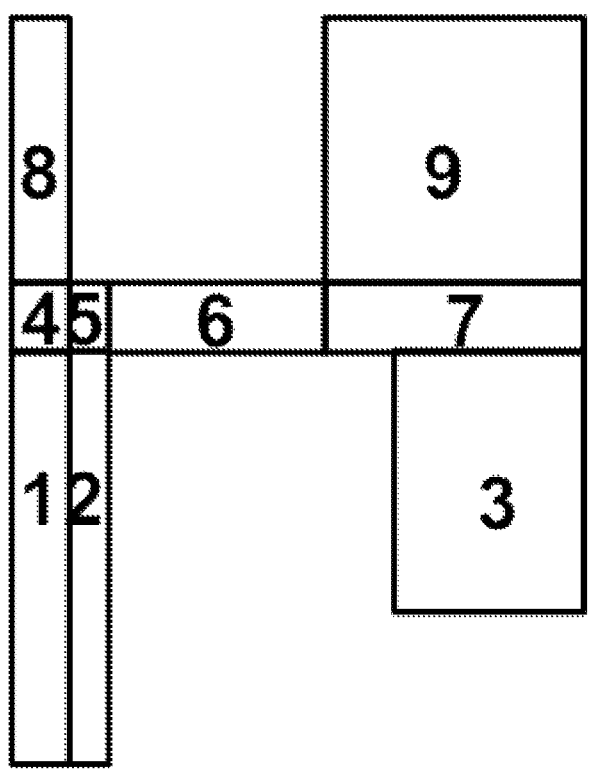
FIGS. 4-8 are schematic representations of the LEF diagram in corresponding steps in accordance with various preferred embodiments of the present invention.

As shown in FIGS. 4-8, which provide schematic representations of the LEF diagram in corresponding steps in accordance with various preferred embodiments of the present invention, and which take the LEF diagram of an output 102 in FIG. 1 as an example, the method for processing the LEF diagram of a layout in accordance with preferred embodiments of the present invention includes the following steps:

Step 1, breaking the LEF diagram into multiple rectangular segments according to the coordinates of vertices, where EDA tools are applied. As shown in FIG. 4, the LEF is divided into 9 rectangular segments.

Step 2, numbering all rectangular segments.

In accordance with a preferred embodiment of the present invention, the rectangular segments are numbered by: dividing all two-dimensional rectangular segments into multiple rows, starting from the bottom row upward, numbering all rectangular segments in each row from left to right in a progressively increasing manner, and taking 1 added to the largest number of each row as the smallest number of next row. As shown in FIG. 4, each of the 9 rectangular segments is given a number in a corresponding area, i.e., the Arabic numerals within the rectangular segments in FIG. 4 are their numbers respectively.

In an alternative embodiment, the rectangular segments may also be numbered by: dividing all two-dimensional rectangular segments into multiple rows, starting from the bottom row upward, numbering all rectangular segments in each row from right to left in a progressively increasing manner, and taking 1 added to the largest number of each row as the smallest number of next row. This numbering method is realized through proper modification of that in accordance with the aforementioned preferred embodiment of the present invention, so it is not described in detail in the specifications.

Alternatively, the rectangular segments may also be numbered by: dividing all two-dimensional rectangular segments into multiple rows, starting from the top row downward, numbering all rectangular segments in each row from left to right in a progressively increasing manner, and taking 1 added to the largest number of each row as the smallest number of next row. This numbering method is readily realized through proper modification of that in accordance with the aforementioned preferred embodiment of the present invention, so it is not described in detail in the specifications.

Alternatively, the rectangular segments may also be numbered by: dividing all two-dimensional rectangular segments into multiple rows, starting from the top row downward, numbering all rectangular segments in each row from right to left in a progressively increasing manner, and taking 1 added to the largest number of each row as the smallest number of next row. This numbering method is readily realized through proper modification of that in accordance with the aforementioned preferred embodiment of the present invention, so it is not described in detail in the specifications.

Alternatively, the rectangular segments may also be numbered by: dividing all two-dimensional rectangular segments into multiple columns, starting from the leftmost column rightward, numbering all rectangular segments in each column from top to bottom in a progressively increasing manner, and taking 1 added to the largest number of each column as the smallest number of next column. This numbering method is readily realized through proper modification of that in accordance with the aforementioned preferred embodiment of the present invention, so it is not described in detail in the specifications.

Alternatively, the rectangular segments may also be numbered by: dividing all two-dimensional rectangular segments into multiple columns, starting from the leftmost column rightward, numbering all rectangular segments in each column from bottom to top in a progressively increasing manner, and taking 1 added to the largest number of each column as the smallest number of next column. This numbering method is readily realized through proper modification of that in accordance with the aforementioned preferred embodiment of the present invention, so it is not described in detail in the specifications.

Alternatively, the rectangular segments may also be numbered by: dividing all two-dimensional rectangular segments into multiple columns, starting from the rightmost column leftward, numbering all rectangular segments in each column from top to bottom in a progressively increasing manner, and taking 1 added to the largest number of each column as the smallest number of next column. This numbering method is readily realized through proper modification of that in accordance with the aforementioned preferred embodiment of the present invention, so it is not described in detail in the specifications.

Alternatively, the rectangular segments may also be numbered by: dividing all two-dimensional rectangular segments into multiple columns, starting from the rightmost column leftward, numbering all rectangular segments in each column from bottom to top in a progressively increasing manner, and taking 1 added to the largest number of each column as the smallest number of next column.

Step 3, combining adjacent rectangular segments to obtain a larger rectangular segment and replacing corresponding uncombined rectangular segments with the larger combined rectangular segment, thereby reducing the total number of rectangular segments in the LEF diagram and reducing the data size of the LEF file.

In accordance with a preferred embodiment of the present invention, the combination in Step 3 is carried out segment by segment according to the numbers of all rectangular segments. The segment by segment combination includes the following steps:

Step 31, checking whether each of the rectangular segments can be combined with its adjacent rectangular segments according to their numbers, and when there are combinable rectangular segments, selecting each combinable rectangular segment and proceeding to Step 32; otherwise, skipping to Step 35;

Preferably, Step 31 is carried out by starting combination check with the rectangular segment with the smallest number and by adding 1 to the number of the rectangular segment which has been checked for the presence of combinable adjacent rectangular segments, till all numbered rectangular segments are checked. In an alternative embodiment, Step 31 is carried out by starting combination check with the rectangular segment with the largest number and by deducting 1 from the number of the rectangular segment which has been checked for the presence of combinable adjacent rectangular segments, till all numbered rectangular segments are checked.

Figure 5A:
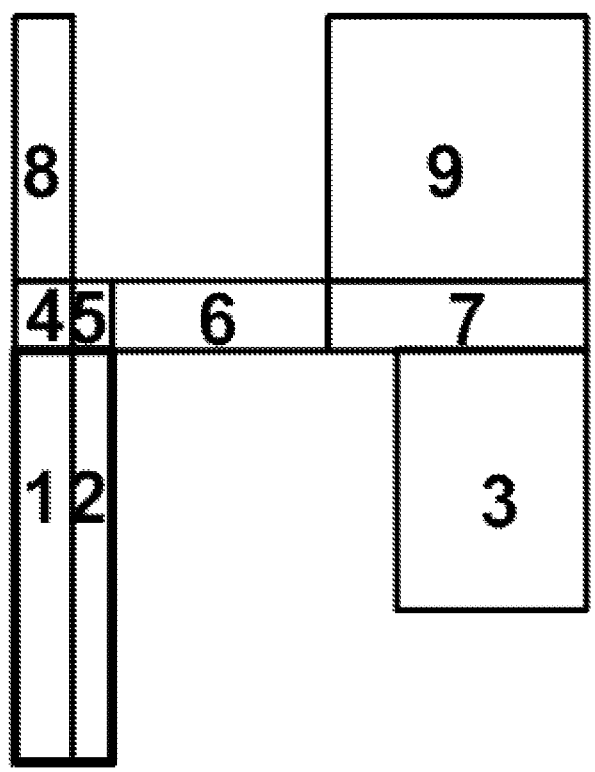
Figure 5B:
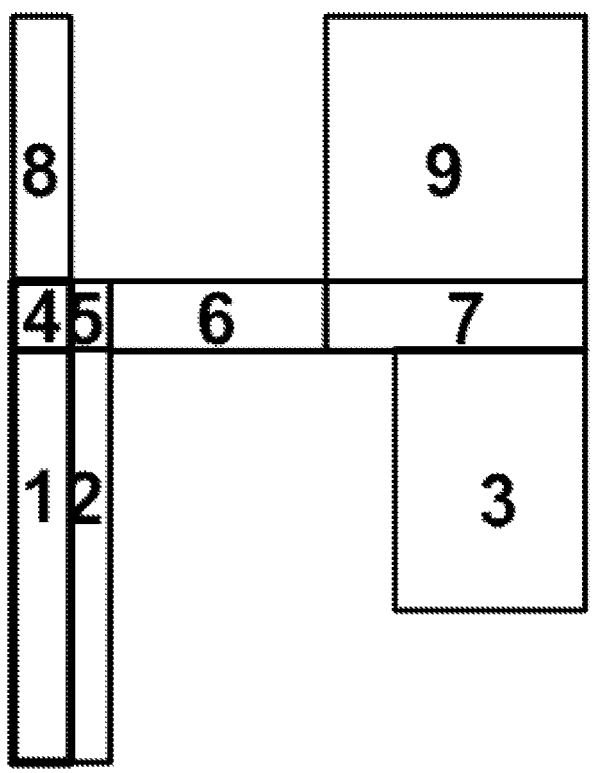

Specifically, as shown in FIG. 5A, 1 is the smallest number, and a rectangular segment numbered 1 can be combined with an adjacent rectangular segment numbered 2; as shown in FIG. 5B, rectangular segment numbered 1 can also be combined with an adjacent rectangular segment numbered 4. In the same way, rectangular segment numbered 4 can be combined with adjacent rectangular segments 1 and 5; rectangular segment numbered 5 can be combined with adjacent rectangular segments 4 and 6; rectangular segment numbered 6 can be combined with adjacent rectangular segments 5 and 7; and the aforementioned rectangular segment numbered 1 can be combined with adjacent rectangular segments 2 and 4; therefore, combinable rectangular segments selected by Step 31 are rectangular segments numbered 1,2, 4, 5, and 6.

Step 32, beginning with the two adjacent rectangular segments which produce the largest combined segment, proceeding with combination segment by segment to obtain combined segments in progressively decreasing size, with the largest combined segment being formed the earliest;

The aforementioned step is described by reference to FIG. 5A and FIG. 5B:

As shown in FIG. 5A and FIG. 5B, the combined rectangular segment made up of rectangular segments numbered 1 and 2 is larger than that made up of rectangular segments numbered 1 and 4; the combined rectangular segment made up of rectangular segments numbered 6 and 7 is larger than that made up of rectangular segments numbered 5 and 6; in combing two rectangular segments, rectangular segments numbered 6 and 7 should be grouped, and rectangular segments numbered 1 and 2 should be grouped, the remaining rectangular segments numbered 4 and 5 should be grouped, and then three groups are combined respectively.

Figure 6:
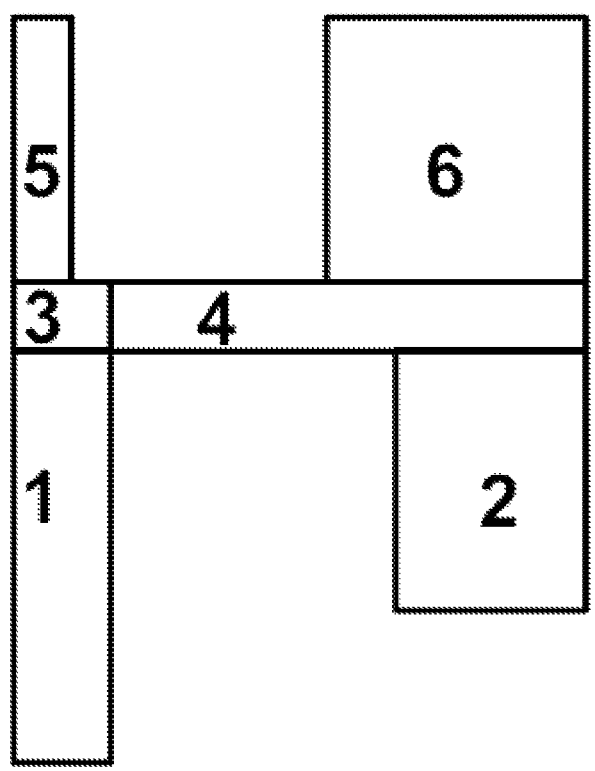

Step 33, renumbering all combined rectangular segments. As shown in FIG. 6, after repeating the aforementioned Step 32 for the first time, the largest number of all rectangular segments changes into 6.

Step 34, repeating Steps 31-33 on each renumbered combined rectangular segment.

Figure 7A:
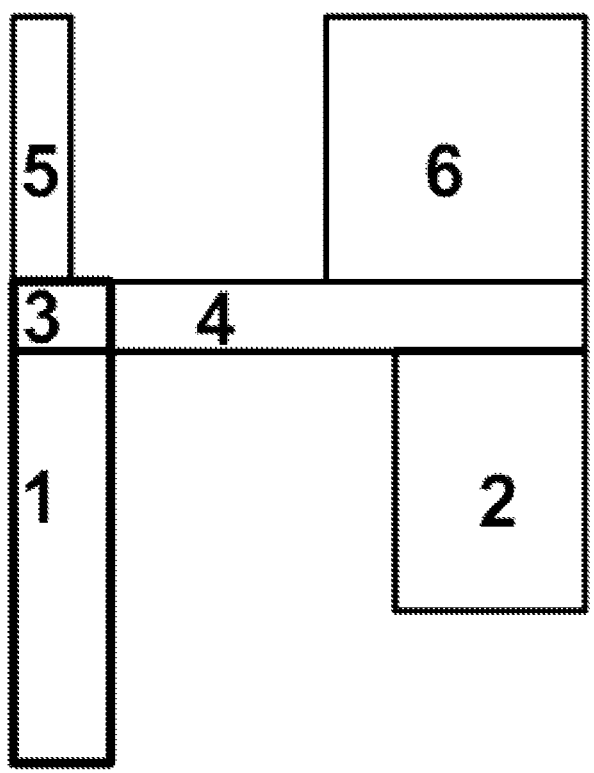
Figure 7B:
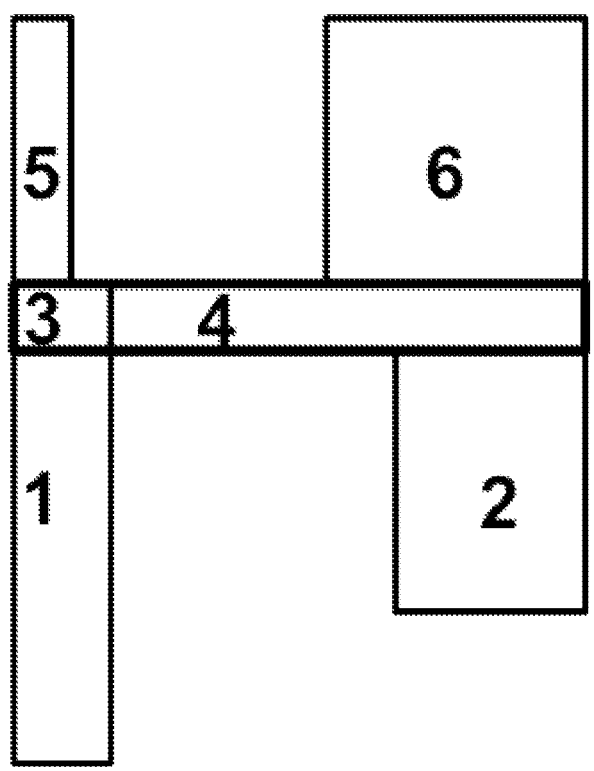

The first repetition of Steps 31-33 is described by reference to FIG. 7A and FIG. 7B:

In Step 31, as shown in FIG. 7A, rectangular segment numbered 1 can be combined with adjacent rectangular segment numbered 3; as shown in FIG. 7B, rectangular segment number 3 can be combined with adjacent rectangular segments numbered 1 and 4; therefore, combinable rectangular segments selected by Step 31 are rectangular segments numbered 1, 3 and 4.

In Step 32, as shown in FIG. 7A and FIG. 7B, the combined rectangular segment made up of rectangular segments numbered 3 and 4 is larger than that made up of rectangular segments numbered 1 and 3, and therefore rectangular segments numbered 3 and 4 are selected to be combined. The LEF diagram after combination is shown in FIG. 8.

Then proceed to the renumbering in Step 33. As shown in FIG. 8, the LEF diagram by FIG. 8 is the final combined diagram.

Figure 8:
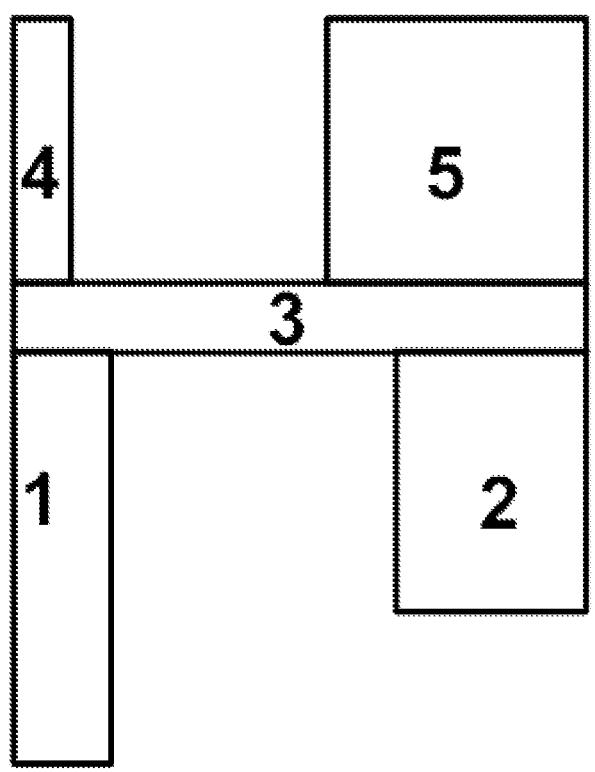

An explanation is given in the following part as to how the data size of the LEF file is reduced in the preferred embodiment of the present invention by reference to FIG. 4 and FIG. 8:

Firstly, the two diagrams in FIG. 4 and FIG. 8 are identical in overall structure.

Secondly, the LEF diagram in FIG. 8 is represented by 5 rectangular segments only, while the LEF diagram in FIG. 4 needs to be represented by 9 rectangular segments.

Moreover, in the LEF diagram, each rectangular segment is obtained by computation with the two-dimensional coordinates of its 4 vertices:

The data size of the LEF diagram in FIG. 4 processed with the prior art is: 9×4 point×(x,y) ×4 byte;

In accordance with the preferred embodiment of the present invention, the data size of the LEF diagram in FIG. 8 is: 5×4 point×(x,y)×4 byte.

It can be seen that by employing the processing method in accordance with the preferred embodiment, the data size can be reduced by more than 40%.

Therefore, the embodiment of the present invention achieves a better compression ratio than the prior art of extracting the LEF diagram with ordinary EDA tools; a reduced data size can also improve the data transmission efficiency, especially for large-scale design data in new processes.

Various embodiments have been used to elaborate on the present invention, but they do not constitute a limitation to the scope of the present invention. Without departing from the principal of the present invention, a technical person in the present art can make various modifications and improvements to the invention, which shall also fall into the scope of the present invention.

What is claimed is:

1. A method for processing the Library Exchange Format (LEF) diagram of a layout, including the following steps:
   Step 1, breaking said LEF diagram into multiple rectangular segments according to the coordinates of vertices of the LEF diagram;
   Step 2, numbering all the rectangular segments; and
   Step 3, combining adjacent said rectangular segments to obtain a larger rectangular segment and replacing corresponding uncombined said rectangular segments with the larger combined rectangular segment, thereby reducing the total number of rectangular segments in said LEF diagram and reducing the data size of said LEF file.

2. The method for processing the LEF diagram of a layout of claim 1, wherein said combination in Step 3 is carried out segment by segment according to serial numbers of said rectangular segments.

3. The method for processing the LEF diagram of a layout of claim 1, wherein said segment by segment combination is carried out in the following steps:

Step 31, checking whether each of said rectangular segments can be combined with any adjacent said rectangular segment according to their serial numbers, and if there are combinable said rectangular segment, selecting each combinable said rectangular segment and proceeding to Step 32; otherwise, skipping to Step 35;

Step 32, beginning with two adjacent said rectangular segments which produce a largest combined segment, proceeding with combination segment by segment to obtain said combined segments in progressively decreasing size, with the largest said combined segment being formed the earliest;

Step 33, renumbering said combined rectangular segments;

Step 34, repeating Steps 31-33 on each said renumbered combined rectangular segment;

Step 35, ending said segment by segment combination.

4. The method for processing the LEF diagram of a layout of claim 3, wherein Step 31 is carried out by starting combination check with a rectangular segment with the smallest number and by adding one to the number of said rectangular segment which has been checked for the presence of combinable adjacent rectangular segments, till all said numbered rectangular segments are checked.

5. The method for processing the LEF diagram of a layout of claim 3, wherein Step 31 is carried out by starting combination check with a rectangular segment with the largest number and by deducting one from the number of said rectangular segment which has been checked for the presence of combinable adjacent rectangular segments, till all said numbered rectangular segments are checked.

6. The method for processing the LEF diagram of a layout of claim 1, wherein Step 1 applies EDA tools to segmentation of said LEF diagram into multiple rectangular segments.

7. The method for processing the LEF diagram of a layout of claim 1, wherein each said rectangular segment is numbered by:
   dividing all said two-dimensional rectangular segments into multiple rows, starting from the bottom row upward, numbering all said rectangular segments in each row from left to right in a progressively increasing manner, and adding one to the largest number of each row as the smallest number of next row;
   alternatively, dividing all two-dimensional rectangular segments into multiple rows, starting from the bottom row upward, numbering all said rectangular segments in each row from right to left in a progressively increasing manner, and adding one to the largest number of each row as the smallest number of next row;
   alternatively, dividing all two-dimensional rectangular segments into multiple rows, starting from the top row downward, numbering all said rectangular segments in each row from left to right in a progressively increasing manner, and adding one to the largest number of each row as the smallest number of next row; and
   alternatively, dividing all two-dimensional rectangular segments into multiple rows, starting from the top row downward, numbering all said rectangular segments in each row from right to left in a progressively increasing manner, and adding one the largest number of each row as the smallest number of next row.

8. The method for processing the LEF diagram of a layout of claim 1, wherein numbering all rectangular segments in is carried out by:
   dividing all two-dimensional rectangular segments into multiple columns, starting from the leftmost column rightward, numbering all said rectangular segments in each column from top to bottom in a progressively increasing manner, and adding one to the largest number of each column as the smallest number of next column;

alternatively, dividing all two-dimensional rectangular segments into multiple columns, starting from the leftmost column rightward, numbering all said rectangular segments in each column from bottom to top in a progressively increasing manner, and adding one to the largest number of each column as the smallest number of next column;

alternatively, dividing all two-dimensional rectangular segments into multiple columns, starting from the rightmost column leftward, numbering all said rectangular segments in each column from top to bottom in a progressively increasing manner, and adding one to the largest number of each column as the smallest number of next column; and alternatively, dividing all two-dimensional rectangular segments into multiple columns, starting from the rightmost column leftward, numbering all said rectangular segments in each column from bottom to top in a progressively increasing manner, and adding one to the largest number of each column as the smallest number of next column.

* * * * *